(12) United States Patent
Gharis

(10) Patent No.: US 7,436,168 B2
(45) Date of Patent: Oct. 14, 2008

(54) TEST ERROR DETECTION METHOD AND SYSTEM

(75) Inventor: Eugene Tudor Gharis, Sherman, TX (US)

(73) Assignee: Texas Instruments Incorporated, Dallas, TX (US)

(*) Notice: Subject to any disclaimer, the term of this patent is extended or adjusted under 35 U.S.C. 154(b) by 279 days.

(21) Appl. No.: 10/989,795

(22) Filed: Nov. 16, 2004

(65) Prior Publication Data

US 2006/0123286 A1 Jun. 8, 2006

(51) Int. Cl.
*G01R 31/26* (2006.01)
(52) U.S. Cl. .................... 324/158.1; 324/765
(58) Field of Classification Search ........... 324/754; 714/721; 257/48
See application file for complete search history.

(56) References Cited

U.S. PATENT DOCUMENTS

| 6,906,341 B2* | 6/2005 | Byun et al. .......... 257/48 |
| 2005/0186690 A1* | 8/2005 | Chen et al. .......... 438/14 |
| 2005/0212538 A1* | 9/2005 | Oborny .......... 324/754 |

OTHER PUBLICATIONS

Automated Wafer Analysis Using Wafer Map Autocorrelation□□Hopcraft, Geoffrey□□ARFTG Conference Digest, 1998. Computer-Aided Design and Test for High-Speed Electronics 52nd□□Dec. 3-4, 1998 pp. 82-87.*

* cited by examiner

*Primary Examiner*—Paresh Patel
(74) *Attorney, Agent, or Firm*—Wade J. Brady, III; Frederick J. Telecky, Jr.; Tum Thach

(57) ABSTRACT

According to one embodiment, a method of test error detection for a wafer having a plurality of rows of integrated circuit (IC) chips is provided. The method includes determining that a first number of IC chips that are indicated as failing a test has increased from a first row to a second row immediately following the first row at least by a first threshold. The method also includes determining that a second number of IC chips that are indicated as failing the test has decreased from a previous row to a second row immediately following the previous row at least by a second threshold. The method also includes indicating that a group of one or more rows located between the first row and the second row includes one or more IC chips that have been tested incorrectly.

36 Claims, 3 Drawing Sheets

TEST ERROR DETECTION METHOD AND SYSTEM

TECHNICAL FIELD OF THE INVENTION

This invention relates generally to electronics and more particularly to a test error detection method and system.

OVERVIEW

Integrated circuit (IC) chips are generally tested to determine whether the chips meet the manufacturer's design specifications. When an IC chip does not pass a test, the chip is indicated as a "failed" or a "bad" chip and can be withheld from consumer use. In some instances, the testing procedure used to test IC chips may be flawed for various reasons, such as a high level of contaminants in the testing environment. Thus, IC chips may be incorrectly indicated as bad chips.

SUMMARY OF EXAMPLE EMBODIMENTS

According to one embodiment, a method of test error detection for a wafer having a plurality of rows of integrated circuit (IC) chips is provided. The method includes determining that a first number of IC chips that are indicated as failing a test has increased from a first row to a second row immediately following the first row at least by a first threshold. The method also includes determining that a second number of IC chips that are indicated as failing the test has decreased from a previous row to a second row immediately following the previous row at least by a second threshold. The method also includes indicating that a group of one or more rows located between the first row and the second row includes one or more IC chips that have been tested incorrectly.

Various embodiments may realize some, none, or all of the following advantages. For example, according to one embodiment, the efficiency of detecting an erroneous test result of an IC chip is improved by using sudden changes in the number of failed chips as an indicator of an erroneous test result. According to one embodiment, test error detection is automated by using a computing device to detect sudden changes in the number of failed chips and using the sudden changes as indicators of erroneous test results. According to another embodiment, the accuracy of test error detection is increased for IC chips. According to another embodiment, the procedure for detecting a test error for an IC chip may be customized depending on the characteristics of a testing environment.

Other advantages may be readily ascertained by those skilled in the art.

BRIEF DESCRIPTION OF THE DRAWINGS

Reference is now made to the following description taken in conjunction with the accompanying drawings, wherein like reference numbers represent like parts, in which.

DETAILED DESCRIPTION OF EXAMPLE EMBODIMENTS

Figure 1:
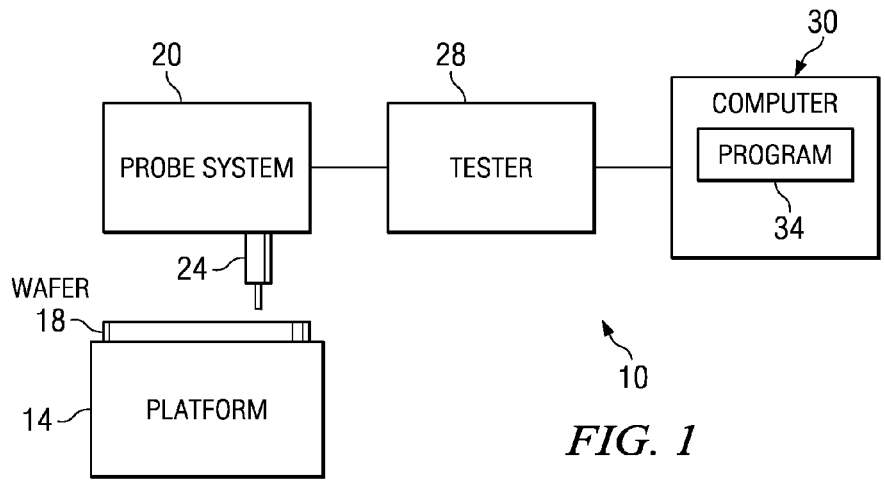
FIG. 1 is a schematic diagram illustrating one embodiment of a testing system.

FIG. 1 is a schematic diagram illustrating one embodiment of a testing system 10. Testing system 10 comprises a platform 14, a probe system 20, a tester 28 coupled to probe system 20, and a computing device 30 coupled to tester 28. In this document, "coupled" or "couple" refers to any direct or indirect connection between two or more objects. Probe system 20 has a probe 24, and computing device 30 has a program 34. Probe 24 may include one or more probes.

Figure 2:
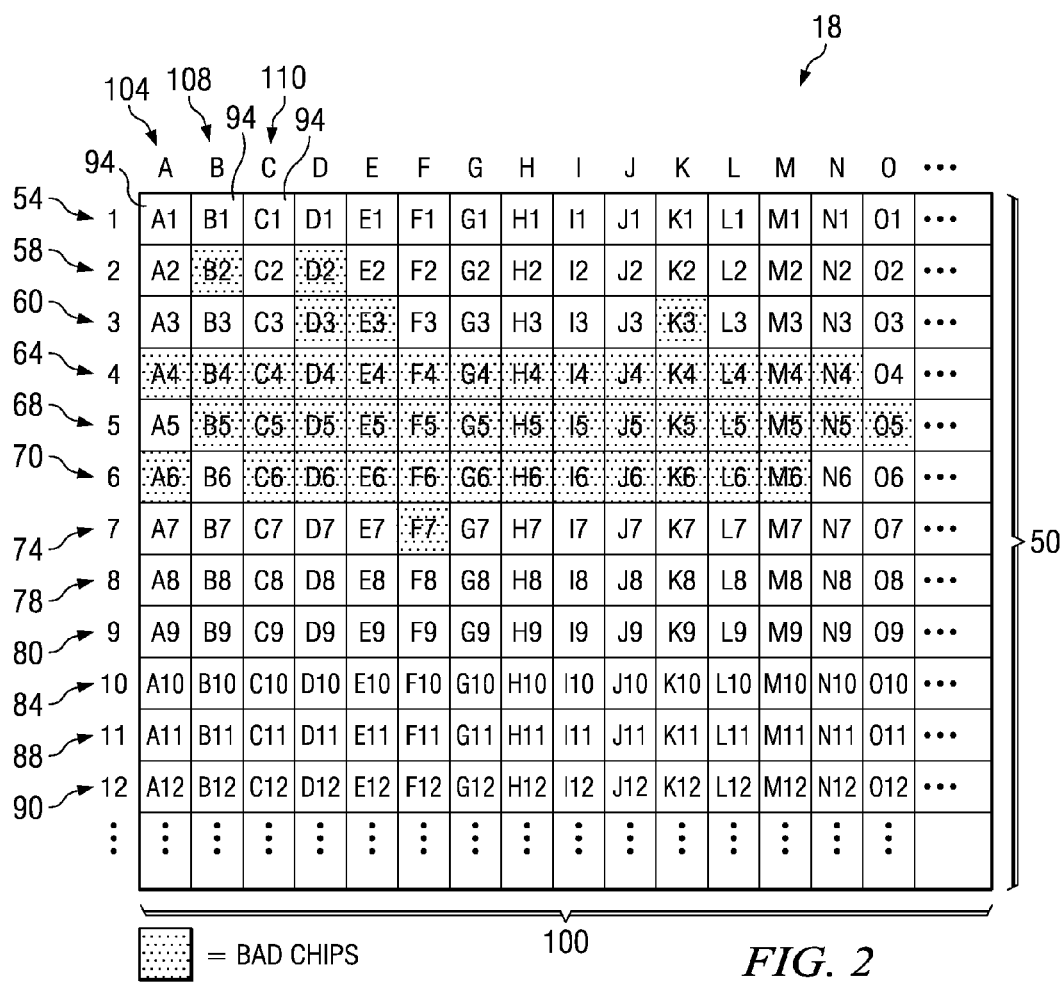
FIG. 2 is a schematic diagram illustrating one embodiment of a wafer shown in FIG. 1.

Platform 14 is operable to support a wafer 18, which comprises a plurality of integrated circuit (IC) chips, and further operable to secure wafer 18 using any suitable means, such as vacuum suction and/or mechanical clamping. IC chips are not explicitly shown in FIG. 1, but are shown in FIG. 2. Probe system 20 is operable to control the movement of probe 24 so that probe 24 can engage one or more electrical contacts of each IC chip of wafer 18. Tester 28 is operable to direct probe system 20 to send and receive information to an IC chip through probe 24 to test the IC chip in various performance categories. Example tests include, but are not limited to, output high/low, VOH (voltage on the output in the high state) failure, VOL (voltage on the output in the low state) failure, and ICC collector supply current collector. Computer 30 is operable to execute program 34 using a processor and collect and/or analyze data received from tester 28. Although probe system 20, tester 28, and computer 30 are shown as separate devices in FIG. 1, any suitable configuration of devices may be used for system 10. For example, computer 30 may be an integral part of tester 28. In some embodiments, probe system 20, tester 28, and computer 30 may be implemented as a single device.

IC chips of wafer 18 are tested to determine whether the chips perform according to the design specifications of the manufacturer. However, the result of the testing may be incorrect due to one or more errors that may occur during the test. For example, a deficient electrical connection between probe 24 and an IC chip due to a high level of contaminants in the testing environment, such as dust particles, may cause the IC chip to be incorrectly identified as a "bad" or a "failed" chip by tester 28. As used in this document, a "bad" or a "failed" chip refers to chips that failed a test for any reason, including chips that are indicated as failing a test but would pass the test if the test were free of error.

According to some embodiments, a system and method for detecting a test error is provided that detects a sudden change in the number of IC chips indicated as failing a test and uses the sudden change as an indication of testing error. This is advantageous in some embodiments because the efficiency of detecting a test error for an IC chip can be improved. In another embodiment, test error detection is automated by using a computing device to detect sudden changes in the number of failed chips and using the sudden changes as an indicator of a test error. In another embodiment, the accuracy of test error detection is increased for IC chips. In another embodiment, the procedure for detecting a test error for an IC chip may be customized depending on the characteristics of a testing environment.

FIG. 2 is a schematic diagram illustrating one embodiment of wafer 18 shown in FIG. 1. Wafer 18 comprises a plurality of chips 94 that are arranged in rows 50 and columns 100, as shown in FIG. 2. For example, rows 50 comprise rows 54 through 90, and columns 100 comprise column 104, 108, 110, and so forth. Although chips 94 of wafer 18 are described as being arranged in rows 50 and columns 100, rows 50 and columns 100 may be switched depending on the particular orientation of wafer 18. For example, columns 100 may be rows 50 and rows 50 may be column 100 if wafer 18 were rotated 90 degrees from the orientation shown in FIG. 2.

Referring to both FIGS. 1 and 2, probe 24 is operable to make an electronic connection with chips 94 of rows 50 so that tester 28 can test chips 94 through probe 24. In some embodiments, probe system 20 manipulates probe 24 so that each row 50 is tested sequentially in the order of its location. For example, probe 24 may engage chips 94 "A1" through "O1" of row 54 in a sequential order ("A1," then "B1," then "C1," and so forth) for testing the chips 94 before moving on to chips 94 "A2" through "O2" of row 58, which is a row that immediately follows row 54. Then probe system 20 moves probe 24 to chips 94 "A3" through "O3" of row 60, which is a row immediately following row 58, and so forth. Probe system 20 may manipulate probe 24 for testing chips 94 of each row 50 sequentially until all rows 50 of wafer 18 are tested. However, in some embodiments, chips 94 may be tested in another order regardless of their order in a particular row 50 or the order of rows 50, and may be tested in groups rather than one chip 94 at a time.

Program 34 is operable to evaluate the number of bad chips 94 in each row 50 sequentially (either from row 54 to row 90 or row 90 to row 54, for example), and determine that a sudden change in the number of bad IC chips 94 has occurred between two rows 50 that are next to each other. Based on the determination, program 34 is operable to indicate that at least one IC chip 94 has been tested incorrectly. In some embodiments, program 34 is operable to determine that the number of chips 94 that are indicated as failing a test has increased from one row 50 to an immediately following row 50 by a first threshold. For example, program 34 is operable to determine that the number of chips 94 indicated as failing a test has increased from row 58 to an immediately following row 60 by the first threshold. In some embodiments, the first threshold equals ten; however, any other suitable value may be used depending, for example, on the factors associated with the testing environment. Program 34 is also operable to determine that the number of chips 94 that are indicated as failing the test has decreased from one row 50 to an immediately following row 50 at least by a second threshold. For example, program 34 is operable to determine that the number of chips 94 indicated as failing a test has decreased from row 70 to an immediately following row 74 by the second threshold. In some embodiments, the second threshold is equal to ten; however, any suitable value may be used depending on the factors associated with the testing environment.

A "sudden change," such as a sudden increase or decrease in the number of chips 94 that are indicated as failing a test from one row to an immediately next row, can be set at a numerical value by, for example, an operator. Examples of such a numerical threshold include the first and the second thresholds described above. The numerical value may be any suitable value depending, for example, on the factors associated with the testing environment, such as the cleanliness of the testing environment, the type of test equipment being used, or other factors. For example, if the level of cleanliness of a testing environment is relatively high, the first and the second thresholds may be set at higher values. The threshold to determine the sudden increase and the threshold to determine the sudden decrease may or may not be equal in value. Program 34 is also operable to identify a row 50 immediately preceding the row 50 where the sudden increase occurred, a row 50 where the sudden decrease occurred, and indicate that a group of one or more rows 50 positioned between the identified two rows 50 includes one or more IC chips 94 that have been tested incorrectly. Additional details concerning potential functionalities of program 34 shown in FIG. 1 are described below in conjunction with FIGS. 3 and 4.

Figure 3:
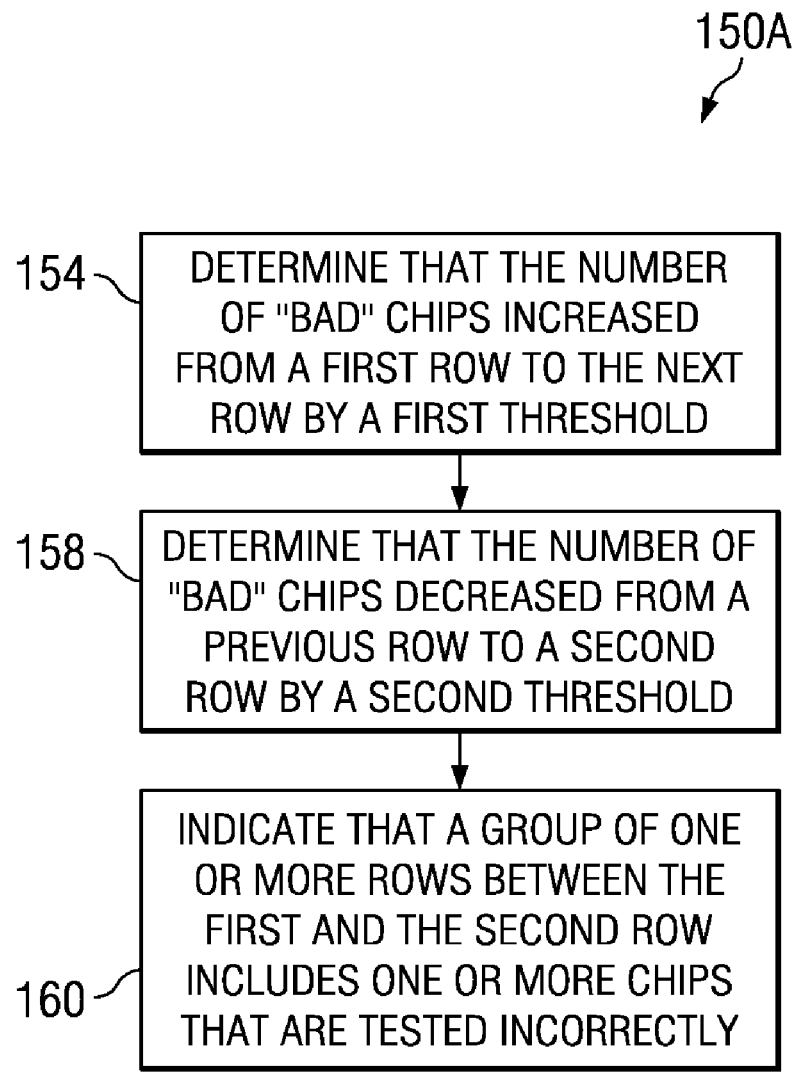
FIG. 3 is a flowchart illustrating one embodiment of a method of test error detection.

FIG. 3 is a flowchart illustrating one embodiment of a method 150A of test error detection. Method 150A may be implemented using any suitable program and/or devices, such as those shown in system 10 of FIG. 1. System 10 and wafer 18 shown in FIGS. 1 and 2, respectively, are used to describe one example of method 150A; however, method 150A may be implemented using any suitable device and used to detect testing error for any suitable wafer.

At step 154, program 34 sequentially evaluates each row 50 in a particular reference direction—row 54 to row 90, for example—and determines that the number of chips 94 that are indicated as failing a test has increased from a first row 50 to a next row 50 following the first row 50 by a first threshold. For example, referring to both FIGS. 1 and 2, tester 28 may indicate that chips 94 labeled "B2" and "D2" in row 58 and "D3," "E3," and "K3" in row 60 fail a test. Tester 28 may also indicate that chips 94 labeled "A4" through "N4"—14 chips in all—in row 64 failed the test. In an example where rows 50 are evaluated in a reference direction that starts from row 54 and goes toward row 90, and where the first threshold that constitutes a sudden increase is set at a value of ten, the increase of the number of bad chips from row 58 to row 60—which is one—would not constitute a sudden increase because the level of increase is below the threshold of ten. However, the increase between rows 60 and 64 is 12, which exceeds the example first threshold of ten, and thus constitutes a "sudden increase."

At step 158, program 34 determines that the number of bad chips 94 has decreased from a previous row 50 to a second row 50 by a second threshold. For example, rows 68, 70, and 74 include 14 bad chips, 12 bad chips, and one bad chip 94, respectively. In an example where the second threshold that constitutes a sudden decrease is set as ten, the decrease of the number of bad chips 94 between rows 64 and 68—which is zero—would not constitute a "sudden decrease" of step 158. The decrease of the number of bad chips 94 between rows 68 and 70—which is two—also would not constitute the sudden decrease of step 158. However, the decrease between rows 70 and 74—which is eleven—exceeds the second threshold, and thus constitutes a sudden decrease of step 158.

Although a value of ten is used as both first and second thresholds of steps 154 and 158, respectively, any suitable value or values may be used. In some embodiments, a value or values in the range of five to 20 may be used. In other embodiments, a value or values for a threshold may be a particular percentage of the total number of chips 94 in a row 50. For example, approximately five percent of the total number of chips 94 in row 50 may be a first and/or a second threshold. In some embodiments, the first and the second thresholds may be different values. In some embodiments, although the sudden increase and the sudden decrease of steps 154 and 158 are described from a reference direction that starts from row 54 and goes to row 90, the sudden increase and decrease may also be determined in a reverse reference direction that starts from row 90 to row 54. In such a case, in the example described above, the sudden increase occurs at row 70 and the sudden decrease occurs at row 60. In some embodiments, program 34 is operable to evaluate each row 50 after tester 28 tests the entire wafer 18. However, in some embodiments, program 34 is operable to evaluate each row 50 while tester 28 is testing each row 50. Additionally, the number of bad chips 94 is determined for chips that fail the same test, in some embodiments. For example, chips 94 that fail the VOH failure test are counted for determining the sudden changes of method 150A.

At step 160, program 34 indicates that a group of one or more rows 50 between the first row 50—row 60—and the second row 50—row 74—includes one or more chips 94 that are tested incorrectly. In this example, the rows between row 60 and row 74 are rows 64 through 70. Thus, rows 64 through 70 are likely to include at least one IC chip 94 that has been incorrectly indicated as failing the test. These rows 64 through 70 may also be referred to as a "streak." Using the indication of step 160, computer 30 may direct tester 28 to take one or more corrective actions depending on whether certain conditions are met. An example of a corrective action includes, but is not limited to, a retest of chips 94 in rows 64 through 70. Additional details of method 150A are described below in conjunction with FIG. 4.

Figure 4:
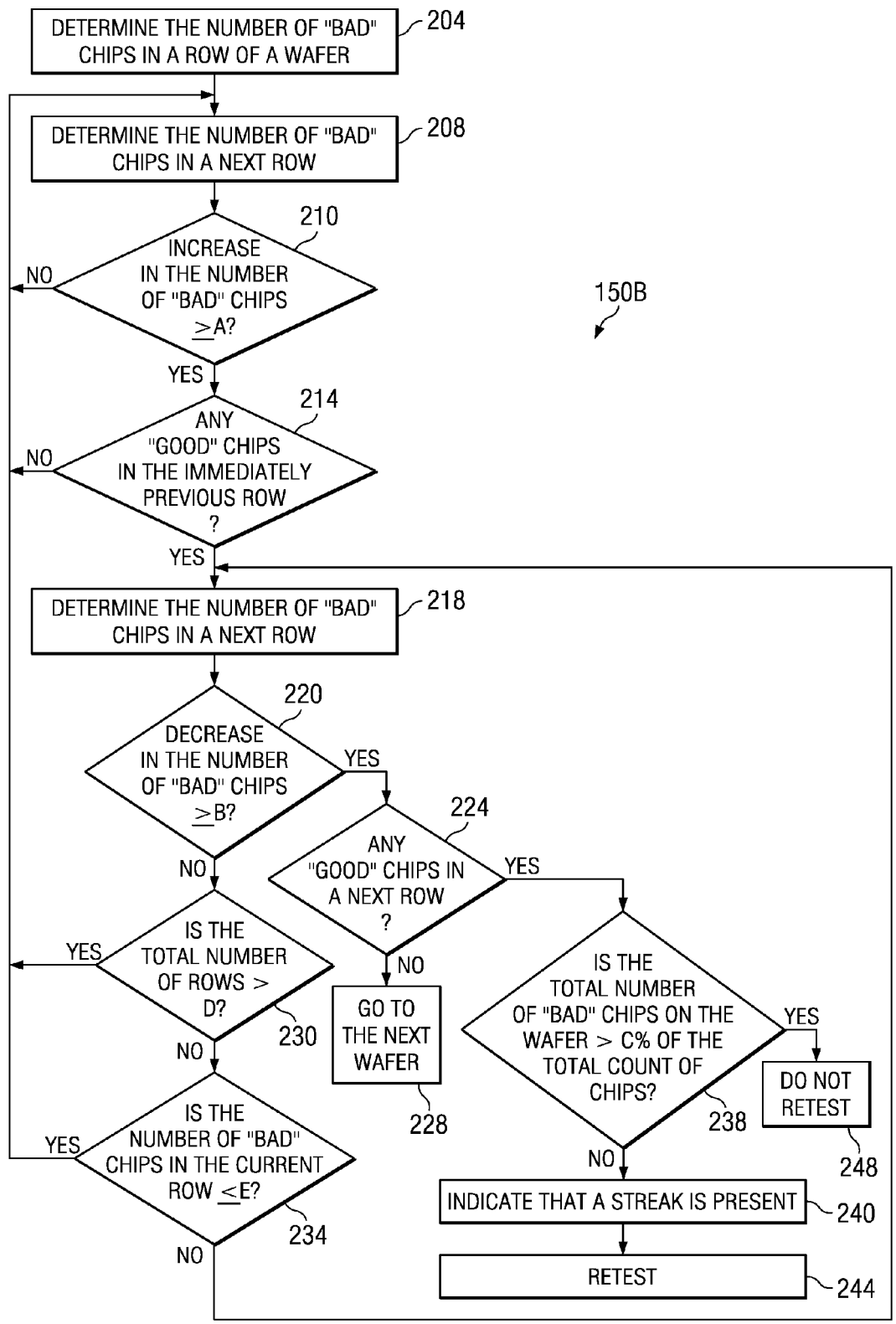
FIG. 4 is a flowchart illustrating one embodiment of a method of test error detection.

FIG. 4 is a flowchart illustrating a method 150B of test error detection. System 10 and wafer 18 shown in FIGS. 1 and 2, respectively, are used to describe one example of method 150B; however, method 150B may be implemented using any suitable device and used to detect testing error for any suitable wafer. The steps 204 through 244 of method 150B may be performed in a different order than the one shown in FIG. 4, as determined by one skilled in the art.

At step 204, program 34 determines the number of bad chips 94 in a row 50 of wafer 18. At step 208, program 34 determines the number of bad chips 94 in an immediately following row 50. For example, program 34 receives from tester 28 a count of bad chips 94 for rows 60 and 64 at steps 204 and 208, respectively. The count for row 60 is three bad chips 94, as shown in FIG. 2. The count for row 64 is 14 bad chips 94, as shown in FIG. 2. Steps 204 and 208 may be performed in conjunction with the testing of chips 94 or after chips 94 have been tested.

At decision step 210, program 34 determines whether the level of increase in the number of bad chips 94 between row 64 and the immediately previous row—row 60—is greater than or equal to a first threshold value. In some embodiments, the first threshold value is set at ten; however, any other suitable value may be used. If the level of increase does not exceed the threshold, then the "no" branch is followed back to step 208. Thus, if the increase in the number of bad chips 94 does not exceed ten, program 34 determines the number of bad chips 94 in the next row, such as row 68, and the increase in the number of bad chips 94 is evaluated between rows 64 and 68, in this example. Referring again to decision step 210, if the level of increase does exceed the threshold, then the "yes" branch is followed to decision step 214. At decision step 214, program 34 determines whether a "good" chip is included in a row that is one or more rows back from the row where the increase of step 210 occurred. A "good" chip refers to a chip 94 that is indicated as passing a test. For example, row 64 is where the increase of step 210 occurred, so at step 214, program 34 determines whether row 60, which is a row that is one row back from row 64, includes at least one chip 94 that passed the test. If no, then the "no" branch is followed back to step 208 where the number of bad chips 94 in the next row—row 68—is determined. If yes, then the "yes" branch is followed to step 218. In some embodiments, step 214 prevents the edge portions of wafer 18 from being counted as a row.

At step 218, program 34 determines the number of bad chips 94 in a next row. In this example, program 34 determines the number of bad chips 94 in row 68, which is the row immediately following row 64. At step 220, program 34 determines whether there is a decrease in the number of bad chips 94 between the row of step 218 and the immediately preceding row of step 218 that is greater than or equal to a second threshold value. For example, program 34 determines whether the count of bad chips 94 decreases from row 64 to row 68. In some embodiments, the second threshold value is equal to ten; however, any other suitable value may be used as second threshold value. In this example, program 34 determines at step 220 whether a decrease, if any, in the number of bad chips 94 between rows 64 and 68 is greater than or equal to ten. If no, then the "no" branch is followed to decision step 230.

At decision step 230, program 34 determines whether the total number of rows between row 60 and row 68 of step 218 is greater than a predetermined threshold number of rows. A step such as step 230 lowers the probability of a false test error detection. In some embodiments, the predetermined number of rows is set at six; however, any suitable value may be used for the threshold number of rows 50. For example, the predetermined number of rows may be set at four, five, six, seven or eight. Referring back to step 230, if yes, then the "yes" branch is followed back to step 208, where the number of bad chips 94 in the next row—row 70—is determined. If no, then "no" branch is followed to decision step 234.

At decision step 234, program 34 determines whether the number of bad chips 94 in the currently counted row—row 68—is less than or equal to a third threshold value. Using the example above, program 34 determines whether the number of bad chips 94 in row 68, which is the currently counted row 50 of step 218, is less than or equal to a third threshold value. If yes, then the "yes" branch is followed to step 208. If no, then "no" branch is followed back to step 218. In some embodiments, the third threshold value is equal to the first and/or the second threshold values of steps 210 and 220; however, the third threshold value may be less than the first and/or the second threshold values, in some embodiments. A step such as step 234 anticipates a scenario where the number of bad chips 94 gradually decreases from row to row until the number is less than the second threshold value.

Referring again to decision step 220, if the decrease in the number of bad chips 94 is greater than or equal to the second threshold value, then the "yes" branch is followed to decision step 224. At decision step 224, program 34 determines whether a row that follows row 64, such as row 68 where the decrease occurred, includes at least one chip 94 that passed the test. If no, then the "no" branch is followed to step 228, where a new wafer is tested. If yes, then "yes" branch is followed to decision step 238. In some embodiments, step 224 prevents the edge portions of wafer 18 from being counted as a row 50.

At decision step 238, program 34 determines whether the total number of bad chips 94 between a row 50 immediately preceding the row 50 where the sudden increase occurred and a row 50 where the sudden decrease occurred is greater than a particular percentage of the total count of chips 94 on wafer 18. For example, when method 150B is applied to the example scenario shown in FIG. 2, the total number of bad chips 94 in rows between rows 60 and 74 is compared to the total number of chips 94 on wafer 18, because row 60 is the row immediately preceding row 64 where the sudden increase as defined by the first threshold of step 210 occurs, and row 74 is where the sudden decrease as defined by the second threshold of step 220 occurs. In other words, the bad chips 94 in rows 64 through 70 are counted and compared to the total number of chips 94 of wafer 18. The particular percentage value may be set at twenty-five percent, in some embodiments; however, any suitable percentage value may used. If yes, then the "yes" branch is followed to step 248, where the chips in the group of rows 50 are not retested. In some embodiments, step 238 increases the accuracy of method 150B. This is because the ratio between the bad chips 94 and the total count of chips 94 on wafer 18 that is too high indicates that bad chips 94 in fact have not passed the test and the indication of failing the test is not due to a test error. Referring back to step 238, if no, then the "no" branch is followed to step 240, where program 34 indicates that IC chips 94 between the rows 50 where sudden changes occurred may have been tested incorrectly. At step 244, program 34 initiates a retesting of the failed chips 94 of step 240.

The threshold values of decision step 210, 220, 238, 230, and/or 234 may be tuned depending on the particular characteristics of the testing environment of wafer 18. For example, where the testing environment is relatively more prone to error, first and second threshold values may be set to lower values, for example, less than ten. Where the testing environment is less prone to testing errors, then the first and second threshold values may be increased. In some embodiments of the invention, portions of method 150B may be omitted and/or modified. For example, steps 214, 224, 230, 234, 238, and/or 228 may be omitted. In some embodiments, only the same type of errors are counted. For example, only the chip 94 that failed the VOL failure test are counted.

An example program code for program 34 that is operable to perform the acts of method 150B is shown below.

```
for (nb=3; nb<16; nb++) // scan by fail bin for streaks
{ nstreaks = 0; // number of streaks found
    bInstreak = false;        // not in-a-streak flag
    nprevgood = nRowbin[0][0] + nRowbin[1][0];        // good chips (bin 1 or 2) on first (0th) row
    nprevbad = nRowbin[nb][0]; // this bin's fail count from first row.
    for (nr=1; nr<header.row_count; nr++) // check from 2nd row to end
    { if (bInstreak)        // currently processing a streak
        { if ((nprevbad − nRowbin[nb][nr]) >= 10) // decrease by 10 from prev row, end streak
            { bInstreak = false;
                nstreaks++; // count the valid streak
            } else if (nRowbin[nb][nr] < 10) // trickled below threshold - abandon - not a streak
            { bInstreak = false;
            } else if (nrows > 5) // max is 5 rows - abandon it
            { bInstreak = false;
            } else        // still in streak
            { nrows++; // count rows in streak
            }
        } else        // not currently processing a streak
        { if (nprevgood > 0 && (nRowbin[nb][nr] − nprevbad) >= 10 ) // increase by 10 and prev row had good chips - start of streak
            { bInstreak = true;
                nrows = 1; // count this as the 1st row of a potential streak
        } }
        nprevbad = nRowbin[nb][nr];
        nprevgood = nRowbin[1][nr] + nRowbin[2][nr]; // good chips in this row (bins 1 and 2 are good chips)
    }
    if (nstreaks > 0) // Action if streak(s) found
        // Streak(s) found. Queue this bin for corrective action (retest).
}
```

Although some embodiments of the present invention have been described in detail, it should be understood that various changes, substitutions, and alterations can be made hereto without departing from the spirit and scope of the invention as defined by the appended claims.

What is claimed is:

1. A method of test error detection for a wafer having a plurality of rows of integrated circuit (IC) chips, comprising:
    determining that a first number of IC chips that are indicated as failing a test has increased by at least a first threshold from a first row to a row following the first row;
    determining that a second number of IC chips that are indicated as failing the test has decreased by at least a second threshold from a row previous to a second row, wherein the second row follows the first row; and
    determining that a group of one or more rows located between the first row and the second row includes one or more IC chips that have been tested incorrectly.

2. The method of claim 1, wherein the first threshold and the second threshold each equals 10.

3. The method of claim 1, wherein the first threshold and the second threshold each equals approximately five percent of a total number of IC chips in a row.

4. The method of claim 1, wherein the first threshold and the second threshold are different values.

5. The method of claim 1, wherein determining that a group of one or more rows includes one or more IC chips that have been tested incorrectly comprises determining that a first total number of IC chips in the group of rows is less than a threshold value, wherein the threshold value comprises a percentage value of a second total number of IC chips in all of the rows of the wafer.

6. The method of claim 5, wherein the percentage value is approximately 25 percent.

7. The method of claim 1, wherein determining that a group of one or more rows includes one or more IC chips that have been tested incorrectly comprises determining whether a number of rows in the group of rows is less than a third threshold.

8. The method of claim 7, wherein the third threshold is equal to 6.

9. The method of claim 1, wherein determining that a group of one or more rows includes one or more IC chips that have been tested incorrectly comprises determining that the first row and the second row each comprises at least one IC chip indicated as passing the test.

10. The method of claim 1, wherein the row following the first row immediately follows the first row.

11. The method of claim 1, wherein the second row immediately follows the row previous to the second row.

12. The method of claim 1, wherein the row following the first row and the row previous to the second row comprise the same row.

13. A system of test error detection, comprising:
a platform operable to support a wafer having a plurality of rows of integrated circuit (IC) chips;
a probe system operable to probe each IC chip;
a testing device coupled to the probe system and operable to test each IC chip through the probe system; and
a computer system operable to:
determine that a first number of IC chips that are indicated as failing a test has increased by at least a first threshold from a first row to a row following the first row;
determine that a second number of IC chips that are indicated as failing the test has decreased by at least a second threshold from a row previous to a second row, wherein the second row follows the first row; and
determine that a group of one or more rows located between the first row and the second row includes one or more IC chips that have been tested incorrectly.

14. The system of claim 13, wherein the first threshold and the second threshold each equals 10.

15. The system of claim 13, wherein the first threshold and the second threshold each equals approximately five percent of a total number of IC chips in a row.

16. The system of claim 13, wherein the first threshold and the second threshold are different values.

17. The system of claim 13, wherein the computer system is operable to determine that a group of one or more rows includes one or more IC chips that have been tested incorrectly by determining that a first total number of IC chips in the group of rows is less than a threshold value, wherein the threshold value comprises a percentage value of a second total number of IC chips in all of the rows of the wafer.

18. The system of claim 17, wherein the percentage value is approximately 25 percent.

19. The system of claim 13, wherein the computer system is operable to determine that a group of one or more rows includes one or more IC chips that have been tested incorrectly by determining whether a number of rows in the group of rows is less than a third threshold.

20. The system of claim 19, wherein the third threshold is equal to 6.

21. The system of claim 13, wherein the computer system is operable to determine that a group of one or more rows includes one or more IC chips that have been tested incorrectly by determining that the first row and the second row each comprises at least one IC chip indicated as passing the test.

22. The system of claim 13, wherein the row following the first row immediately follows the first row.

23. The system of claim 13, wherein the second row immediately follows the row previous to the second row.

24. The system of claim 13, wherein the row following the first row and the row previous to the second row comprise the same row.

25. An apparatus for detecting an error of a test conducted on a wafer having a plurality of rows of integrated circuit (IC) chips, the apparatus comprising:
a computer-readable medium; and
a program stored in the computer-readable medium, the program, when executed using a processor of a computer, operable to:
determine that a first number of IC chips that are indicated as failing a test has increased by at least a first threshold from a first row to a row following the first row;
determine that a second number of IC chips that are indicated as failing the test has decreased by at least a second threshold from a row previous to a second row, wherein the second row follows the first row; and
determine that a group of one or more rows located between the first row and the second row includes one or more IC chips that have been tested incorrectly.

26. The apparatus of claim 25, wherein the first threshold and the second threshold each equals 10.

27. The apparatus of claim 25, wherein the first threshold and the second threshold each equals approximately five percent of a total number of IC chips in a row.

28. The apparatus of claim 25, wherein the first threshold and the second threshold are different values.

29. The apparatus of claim 25, wherein the program is operable to determine that a group of one or more rows includes one or more IC chips that have been tested incorrectly by determining that a first total number of IC chips in the group of rows is less than a threshold value, wherein the threshold value comprises a percentage value of a second total number of IC chips in all of the rows of the wafer.

30. The apparatus of claim 29, wherein the percentage value is approximately 25 percent.

31. The apparatus of claim 25, wherein the program is operable to determine that a group of one or more rows includes one or more IC chips that have been tested incorrectly by determining whether a number of rows in the group of rows is less than a third threshold.

32. The apparatus of claim 31, wherein the third threshold is equal to 6.

33. The apparatus of claim 25, wherein the program is operable to determine that a group of one or more rows includes one or more IC chips that have been tested incorrectly by determining that the first row and the second row each comprises at least one IC chip indicated as passing the test.

34. The apparatus of claim 25, wherein the row following the first row immediately follows the first row.

35. The apparatus of claim 25, wherein the second row immediately follows the row previous to the second row.

36. The apparatus of claim 25, wherein the row following the first row and the row previous to the second row comprise the same row.

* * * * *